United States Patent [19]

Coffman et al.

[11] Patent Number: 5,396,115
[45] Date of Patent: Mar. 7, 1995

[54] CURRENT-SENSING POWER-ON RESET CIRCUIT FOR INTEGRATED CIRCUITS

[75] Inventors: Tim M. Coffman, Sugar Land; Phat C. Truong; Sung-Wei Lin, both of Houston, all of Tex.; T. Damodar Reddy, Nalgonda, India; Dennis R. Robinson, Needville, Tex.

[73] Assignee: Texas Instruments Incorporated, Dallas, Tex.

[21] Appl. No.: 149,245

[22] Filed: Oct. 26, 1993

[51] Int. Cl.⁶ ............................................. H03K 17/22
[52] U.S. Cl. .................................. 327/143; 327/77; 327/78; 327/198; 327/399
[58] Field of Search ............... 307/272.3, 296.4, 296.5, 307/296.6, 296.8, 354, 362, 572, 576, 585, 592, 594

[56] References Cited

U.S. PATENT DOCUMENTS

| | | | |
|---|---|---|---|
| 3,895,239 | 7/1975 | Alaspa | 307/272.3 |
| 4,053,340 | 3/1985 | Linder | 307/363 |
| 5,039,875 | 8/1991 | Chang | 307/272.3 |
| 5,187,389 | 2/1993 | Hall et al. | 307/272.3 |
| 5,302,861 | 4/1994 | Jelinek | 307/272.3 |
| 5,319,255 | 6/1994 | Garverick et al. | 307/272.3 |
| 5,329,171 | 7/1994 | Shimizu et al. | 307/354 |

FOREIGN PATENT DOCUMENTS

| | | | |
|---|---|---|---|
| 54-154365 | 12/1979 | Japan | 307/272.3 |
| 55-47727 | 4/1980 | Japan | 307/272.3 |
| 63-266921 | 11/1988 | Japan | 307/272.3 |
| 2-154520 | 6/1990 | Japan | 307/272.3 |

*Primary Examiner*—Terry D. Cunningham
*Attorney, Agent, or Firm*—Theodore D. Lindgren; Leo N. Heiting; Richard L. Donaldson

[57] ABSTRACT

The power-on reset circuit of this invention includes a current-sensing circuit, a pulse-stretching circuit, and a voltage-reference circuit. The voltage-reference circuit consists, for example, of one N-Channel and one P-Channel MOS transistor. The circuit of this invention uses a static voltage reference comprised of CMOS transistors to detect the power-up condition. The circuit of this invention improves detection of a transient power-supply voltage Vcc loss and detects that power-supply voltage transient on both rising and falling edges.

16 Claims, 3 Drawing Sheets

CURRENT-SENSING POWER-ON RESET CIRCUIT FOR INTEGRATED CIRCUITS

BACKGROUND OF THE INVENTION

The present invention relates to integrated-circuits and, in particular, to a circuit and method for a power-on reset sequence in integrated circuits.

One problem in the design of integrated circuits is related the power supply Vcc having a voltage below the minimum level required for proper circuit operation. The power supply Vcc has momentary low voltages during start-up, during shut-down and during system transients. The supply voltage may also have a low voltage if a battery is faulty or is aging. A very low value of power-supply voltage can cause spurious operation of the integrated circuit and, consequently, of any device controlled by that integrated circuit. For example, in a nonvolatile memory, a very low value of power-supply voltage during power-up can cause undesired programming or erasure of the device. In turn, undesired programming or erasure causes loss of integrity of data, adversely affecting the operation of any devices dependent on that data.

There is a need for an improved detection circuit to furnish a signal indicating that the power-supply voltage is below the minimum level for the proper operation of the integrated-circuit system. That signal could then be used to inhibit spurious operation of particular electronic systems within the integrated circuit. Ideally, such detection circuitry should function in a "static" manner, detecting both rising and falling transitions of a power supply through the minimum level for operation.

Prior-art circuitry includes use of bipolar devices to implement a voltage reference function for detection. Other prior-an circuitry includes use of a dynamic detection design that requires a latching circuit or a very large capacitor. The prior art circuitry fails to detect transient loss of the power-supply voltage after an initial power-up condition has occurred. In addition, many of the prior-art power-up circuits require the power-supply voltage to drop substantially lower than the initial detection level for a long period of time before being sensed. Also, some prior-art circuits detect only the rising-edge state of the switched power-supply voltage.

Prior-art circuits and methods include those described in the following articles: (1) "Power Supply Voltage Monitors Maintain Microprocessor Data Integrity "; Larry Shorthill; PCIM; June 1990; (2) "Circuit resets CMOS uPs"; Hans Eichel; EDN; Mar. 22, 1984; and (3) "Reset circuit solves brownout problems"; Damian Bonicatto; EDN; Oct. 16 1986. Other prior-art circuits are described in the following patents: (1) U.S. Pat. No. 4,558,233 issued Dec. 10, 1985, entitled "CMOS Power-On Reset Pulse Generating Circuit with Extended Reset Pulse Duration"; (2) U.S. Pat. No. 4,633,107 issued Dec. 30, 1986, entitled "CMOS Power-UP Reset Circuit for Gate Arrays and Standard Cells"; (3) U.S. Pat. No. 5,111,067 issued May 5, 1992, entitled "Power UP Reset Circuit"; (4) U.S. Pat. No. 4,698,531 issued Oct. 6, 1987, entitled "Power-On Reset Circuit"; (5) U.S. Pat. No. 4,746,822 issued May 24, 1988, entitled "CMOS Power-On Reset Circuit"; (6) U.S. Pat. No. 4,812,679 issued Mar. 14, 1989, entitled "Power-On Reset Circuit"; (7) U.S. Pat. No. 4,885,476 issued Dec. 5, 1989, entitled "Power-On Reset Circuit"; (8) U.S. Pat. No. 4,888,497 issued Dec. 19, 1989 entitled "Generator of Reset Pulses Upon the Rise of the Power Supply for CMOS-Type Integrated Circuits"; and (9) U.S. Pat. No. 4,888,498 issued Dec. 19, 1989, entitled "Integrated-Circuit Power-Up Pulse Generator Circuit".

SUMMARY OF THE INVENTION

The current-mode, power-on reset circuit of this invention comprises a current-sensing circuit; a pulse-stretching circuit; and a voltage-reference circuit including, for example, one N-Channel and one P-Channel MOS transistor.

A difference between the circuit of this invention and prior-art power-on reset circuits is that the circuit of this invention uses a static voltage reference comprised of CMOS transistors to detect the power-up condition. The circuit of this invention generates a reset pulse whenever the power-supply voltage Vcc is less than approximately 3 V.

An advantage of the circuit of this invention is that the detection of a transient power-supply voltage Vcc loss is greatly improved. Another advantage is that detection occurs on both rising and falling edges of the power-supply voltage Vcc.

In flash EPROM memories, for example, the circuit of this invention prevents undesired alteration (programming/erasure) of the device during the power-up sequence.

DETAILED DESCRIPTION OF THE INVENTION

While the circuit of this invention is applicable to any electronic system/circuit implemented with CMOS devices, an EEPROM memory is used by way of example to describe its use.

Figure 1:
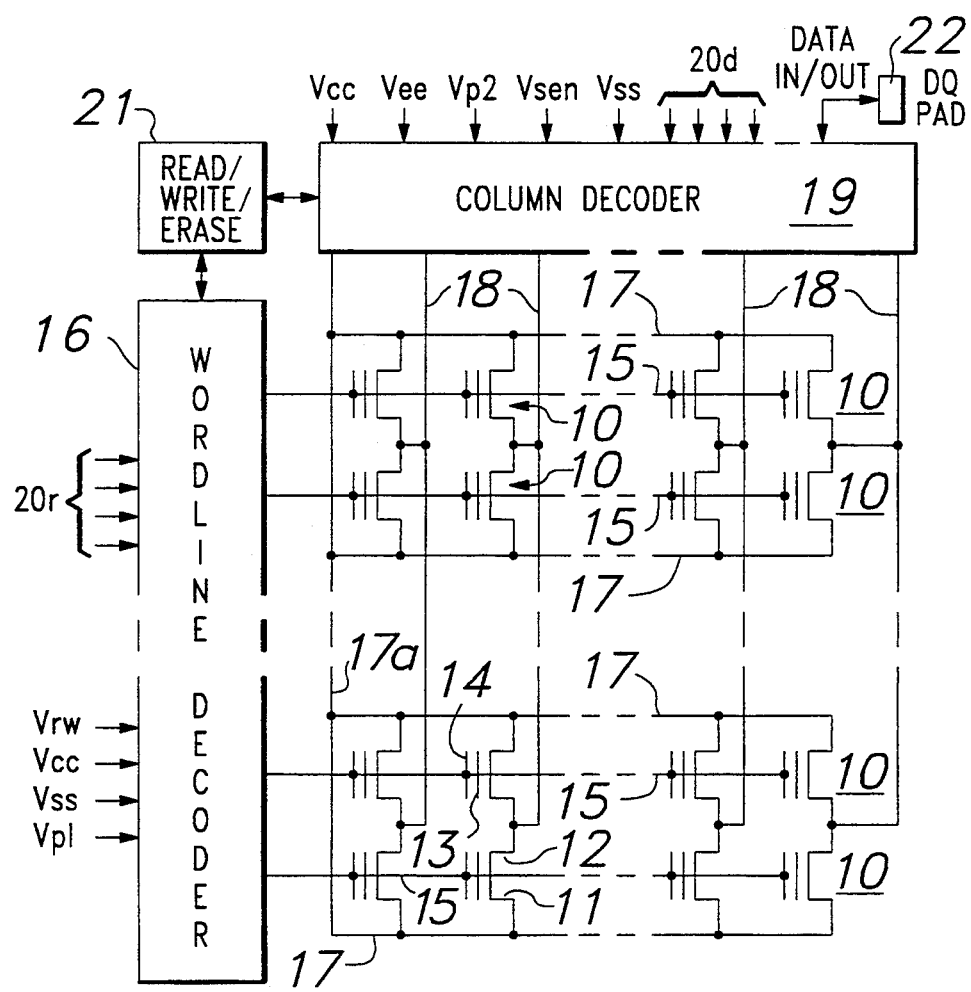
FIG. 1 is an electrical schematic diagram, in partial block form, of an exemplary EEPROM integrated circuit in which the circuit and method of this application may be used.

Referring to FIG. 1, an example array of memory cells, which is an integral part of a memory chip, is shown for the purpose of illustrating use of the circuit and method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (which may include circuitry of an external microprocessor, not shown), to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

In a write, or program, mode the wordline decoder 16 may function, in response to wordline address signals on lines 20r and to signals from Read/Write/Erase control circuit 21, to place a preselected first programming voltage Vp1 (approx. +12 V) on a selected wordline 15, including a selected control-gate 14. Column decoder 19 also functions to place a second programming voltage Vp2 (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with Vp1 at 0 V). For memory cells 10 fabricated in accordance with the example embodiment, the coupling coefficient between a control gate 14/wordline 15 and a floating gate 13 is approximately 0.6. Therefore, a prior-art programming voltage Vp1 of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 V) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash-erase mode, the column decoder 19 functions to leave all drain-column lines 18 floating (connected to a high impedance such as field-effect transistor biased in "OFF" condition). The wordline decoder 16 functions to connect all the wordlines 15 to reference potential Vss, which may be ground. The column decoder 19 also functions to apply a high positive voltage Vee (approx. +9 V to +15 V) to all the source lines 17. These erasing voltages create sufficient field strength across the gate oxide region to generate a Fowler-Nordheim tunnel current that transfers charge from the floating gate 13, erasing the memory cell 10.

For convenience, a table of read, write and erase voltages, is given in TABLE I below:

TABLE I

|  | Read | Write | Flash Erase |
| --- | --- | --- | --- |
| Selected Wordline | 5V | 12V | 0V (All) |
| Deselected Wordlines | 0V | 0V | — |
| Selected Drain Line | 1.0V | 5-10V | Float (All) |
| Deselected Drain Lines | 0V/Float | 0V/Float | — |
| Source Lines | 0V | 0V | 9-15V (All) |

Figure 2:
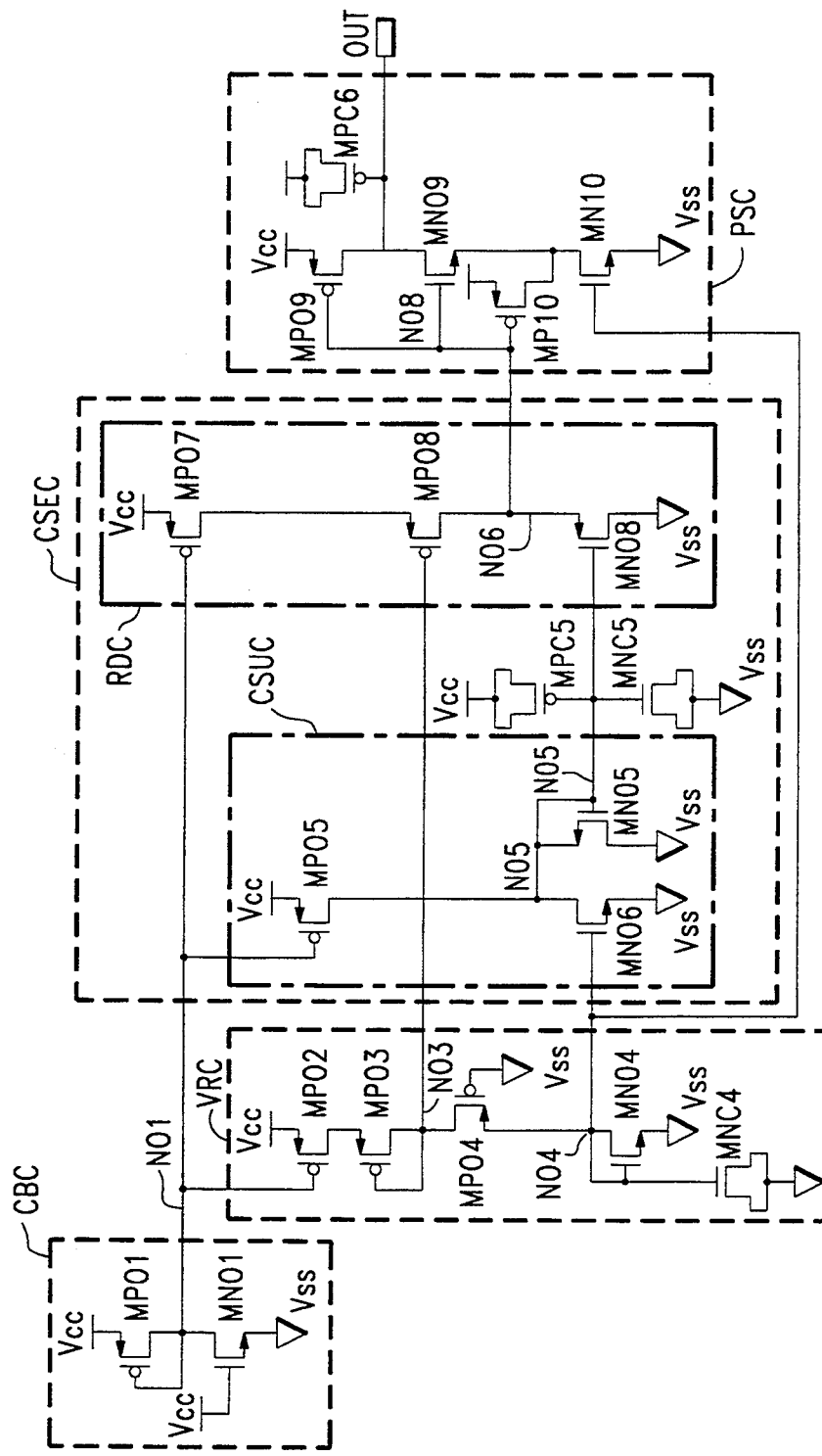
FIG. 2 is a schematic diagram of the current-mode power-on reset circuit of this invention.

Referring now to FIG. 2, transistors MN01, MP01, MP02, MP03, MP04, MN04, MP05, MN05, MN06, MP07, MP08, MN08, MNC4, MPC5 and MNC5 form a power-supply level-detection circuit.

Transistors MN01 and MP01 form a current-bias circuit CBC for establishing a maximum current for the voltage-reference circuit VRC and the current-sensing circuit CSEC, which are described below. N-channel transistor MN01 is biased in the linear region to implement a resistive load. Transistor MN01 is a very long-channel device establishing a current of approximately four microamperes through P-channel transistor MP01. P-channel transistor MP01 forms a current mirror by connecting its gate to its drain. The current through transistor MP01 is mirrored through P-channel transistors MP02, MP05 and MP07, of the voltage-reference circuit VRC and the current-sensing circuit CSEC.

P-channel transistors MP02, MP03 and MP04 and N-channel transistor MN04 form the voltage-reference circuit VRC. P-channel transistor MP03 and N-channel transistor MN04 have gates connected to drains, forming MOS diodes that are used for voltage detection and for current mirrors.

The current-sensing circuit CSEC comprises a current-summing circuit CSUC and a reset-detection circuit RDC.

P-channel transistor MP05 and N-channel transistors MN05 and MN06 form the current-summing circuit CSUC of the current-sensing circuit CSEC. The current through transistor MP05 is equal to the current through transistor MP01. N-channel transistor MN06 equals a multiple (in this case a multiple of three) of the current through transistor MN04. The current supplied by transistor MP05 is shared by transistors MN05 and MN06. The current through transistor MN05 is mirrored to N-channel transistor MN08 of the reset-detection circuit RDC, discussed below.

P-channel transistors MP07 and MP08 and N-channel transistor MN08 form the reset-detection circuit RDC of the current-sensing circuit CSEC. The current through transistor MP01 is mirrored through transistor MP07. The current through transistor MP03 is mirrored by transistor MP08 and multiplied (in this case by three times). Transistor MN08 mirrors the current through transistor MN05 and multiplies that current by a factor of six.

The capacitors formed by N-channel transistors MNC4 and MNC5 and P-channel transistor MPC5 are present to slow the response time of nodes N04 and N05. Nodes N04 and N05 are filtered by these capacitors to ensure detection of short drop-outs of the power-supply voltage Vcc after the initial power-up sequence has occurred.

A pulse-stretching circuit PSC is implemented by P-channel transistors MP09 and MP10, N-channel transistors MN09 and MN 10, and capacitor MPC6. Transistors MP09, MN09 and MP10 are large switching devices that switch the output signal POR4 to a high voltage quickly when node N06 falls to a low voltage. Current in transistor MN10 is mirrored by transistor MN04 to slowly discharge large capacitor MPC6 when node N06 is high. The purpose of this pulse-stretching stage is to ensure a minimum reset pulse-width (node POR4 high) is generated, even if a nearly instantaneous ramp of the power-supply voltage Vcc occurs.

Figure 3:
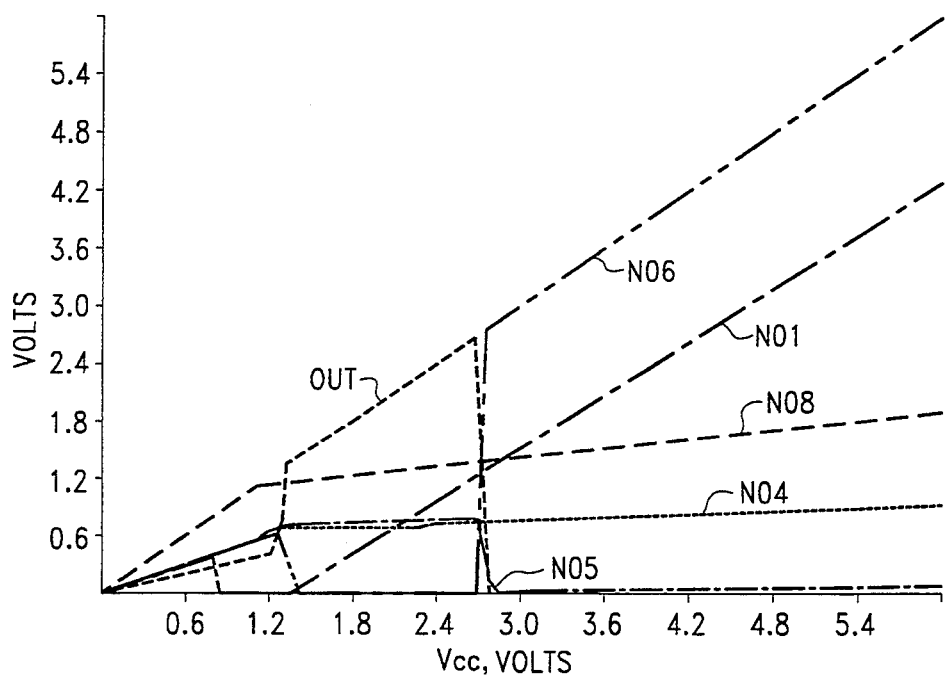
FIG. 3 is a computer simulation showing the voltages of major circuit nodes in FIG. 2.
Figure 4:
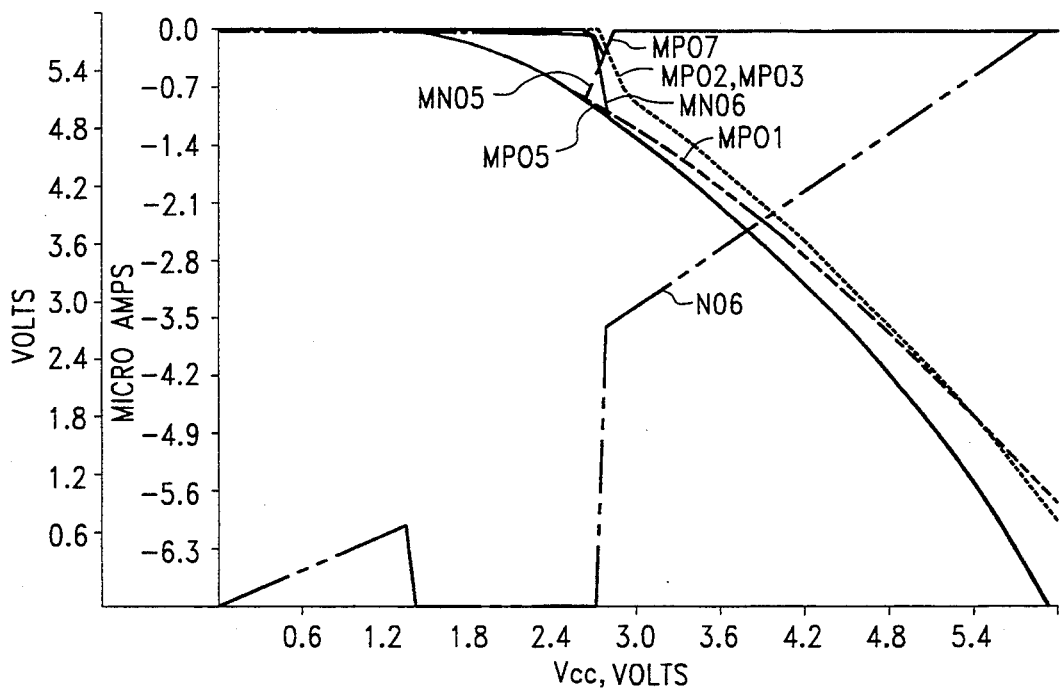
FIG. 4 is a computer simulation showing the device currents of interest in FIG. 2.

The computer simulations in FIGS. 3 and 4 illustrate the operation of the circuit of FIG. 2. FIG. 3 shows the voltages of major circuit nodes as indicated. FIG. 4 shows the currents through primary control transistors with the voltage on node N06 superimposed. In this simulation, the power-supply voltage Vcc is ramped from zero to six volts. When the power-supply voltage Vcc equals one N-channel threshold voltage (0.8 V), transistor MN01 begins to conduct, bringing node N01 to ground, or reference potential terminal Vss. When the power-supply voltage Vcc reaches one P-channel threshold voltage (1.2 V), transistors MP01 and MP05 begin to conduct. The current through transistor MP05 is mirrored by transistor MN05 into transistor MN08 which causes a decrease in the voltage at node N06. When the voltage at node N06 is low, the output signal at node OUT is switched to a high voltage by the pulse-stretching circuit PSC. At this point, transistors MP02, MP03, MP04, MN04 and MN06 are essentially non-conducting. When the power-supply voltage Vcc is increased to greater than the sum of the threshold voltages of P-channel transistors MP03 and MP04 (2.7 V), the voltage-reference circuit VRC consisting of transistors MP02, MP03, MP04 and MN04 begins to conduct. The current through transistor MP03 is mirrored by transistor MP08. The current through transistor MN04 is mirrored by transistor MN06. The current through transistor MN06 is subtracted from the current through transistor MN05, which determines the current through transistor MN08. As the power-supply voltage Vcc continues to ramp, the voltage on node N06 increases because the conductance of transistor MP08 is increasing and the conductance of transistor MN08 is decreasing. When node N06 is high, the pulse-stretching circuit discharges the output signal POR4 to a low voltage at a rate determined by the current through transistor MN04.

The use of transistors MN04 and MP03 to form a voltage-reference circuit VRC for triggering the pulse-stretching circuit allows reliable detection of both rising and falling transitions of power-supply voltage Vcc. The voltage reference is detected by a current-sensing circuit CSEC composed of transistors MP05, MN06, MN05, MN08, MP08 and MP07. Maximum current drain biasing is accomplished by transistors MP01 and MN01.

The method described herein for indicating that a power-supply voltage is below a certain level comprises the steps of (1) establishing a maximum current; (2) mirroring that maximum current to a voltage-reference circuit and to a current-sensing circuit, the current-sensing circuit including a current-summing circuit and a reset-detection circuit; (3) coupling the outputs of the voltage-reference circuit to the current-summing circuit and to the reset-detection circuit; and (4) coupling the output of the reset-detection circuit to a pulse stretching circuit. The output of the pulse-stretching circuit provides a signal indication if the power-supply voltage is below the certain level.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A power-on reset circuit having a supply-voltage terminal, a reference-potential terminal and an output, said circuit comprising:
    a current-bias circuit coupled to said supply-voltage terminal and said reference-potential terminal and having an output;
    a voltage-reference circuit having an input and having first and second outputs, said input of said voltage-reference circuit coupled to said output of said current-bias circuit;
    a current-sensing circuit having first, second and third inputs and an output, said first input of said current-sensing circuit coupled to said output of said current-bias circuit and said second and third inputs of said current-sensing circuit coupled to respective first and second outputs of said voltage-reference circuit; and
    a pulse-stretching circuit having first and second inputs and an output, said first input of said pulse-stretching circuit coupled to said output of said current-sensing circuit, said second input of said pulse stretching circuit coupled to said second output of said voltage-reference circuit, said output of said pulse-stretching circuit coupled to said output of said power-on reset circuit.

2. The circuit of claim 1, wherein said current-bias circuit further comprises:
    a P-channel transistor having a gate and first and second source-drains, said first source-drain coupled to said supply-voltage terminal, said gate coupled to said second source-drain, said second source-drain coupled to said output of said current-bias circuit; and
    a N-channel transistor having a gate and first and second source-drains, said first source-drain of said N-channel transistor coupled to said output of said current-bias circuit, said gate of said N-channel transistor coupled to said supply-voltage terminal and said second source-drain of said N-channel transistor coupled to said reference-potential terminal.

3. The circuit of claim 2, further including a channel length for said N-channel transistor and a channel length for said P-channel transistor, wherein said channel length of said N-channel transistor is longer than said channel length of said P-channel transistor.

4. The circuit of claim 1, wherein said voltage-reference circuit further comprises:
    a first P-channel transistor having a gate and first and second source-drains, said first source-drain coupled to said supply-voltage terminal, said gate coupled to said output of said current-bias circuit;
    a second P-channel transistor having a gate and first and second source-drains, said first source-drain of said second P-channel transistor coupled to said second source-drain of said first P-channel transistor, said gate of said second P-channel transistor and said second source-drain of said second P- channel transistor both coupled to said first output of said voltage-reference circuit;

a third P-channel transistor having a gate and first and second source-drains, said first source-drain of said third P-channel transistor coupled to said first output of said voltage-reference circuit, said gate of said third P-channel transistor coupled to said reference-potential terminal, said second source-drain of said third P-channel transistor coupled to said second output of said voltage-reference circuit;

a N-channel transistor having a gate and first and second source-drains, said gate of said N-channel transistor and said first source-drain of said N-channel transistor both coupled to said second output of said voltage-reference circuit, said second source-drain of said N-channel transistor coupled to said reference-potential terminal; and a capacitor coupled between said second output of said voltage-reference circuit and said reference-potential terminal.

5. The circuit of claim 1, wherein said current-sensing circuit further comprises:

a current-summing circuit having first and second inputs and an output, said first and second inputs of said current-summing circuit coupled respectively to said first and third inputs of said current-sensing circuit;

a reset-detection circuit having first, second and third inputs and an output, said first input of said reset-detection circuit coupled to said first input of said current-sensing circuit, said second input of said reset-detection circuit coupled to said second input of said current-sensing circuit, said third input of said reset-detection circuit coupled to said output of said current-summing circuit, said output of said reset-detection circuit coupled to said output of said current-sensing circuit;

a first capacitor coupled between said output of said current-summing circuit and said supply-voltage terminal; and a second capacitor coupled between said output of said current-summing circuit and said reference-potential terminal.

6. The circuit of claim 5, wherein said current-summing circuit further comprises:

a P-channel transistor having a gate and first and second source-drains, said first source-drain coupled to said supply-voltage terminal, said gate coupled to said first input of said current-summing circuit, said second source-drain coupled to said output of said current-summing circuit;

a first N-channel transistor having a gate and first and second source-drains, said first source-drain of said first N-channel transistor coupled to said output of said current-summing circuit, said gate of said first N-channel transistor coupled to said third input of said current-sensing circuit, said second source-drain of said first N-channel transistor coupled to said reference-potential terminal; and a second N-channel transistor having a gate and first and second source-drains, said first source-drain and said gate of said second N-channel transistor both coupled to said output of said current-summing circuit, said second source-drain of said second N-channel transistor coupled to said reference-potential terminal.

7. The circuit of claim 5, wherein said reset-detection circuit further comprises:

a first P-channel transistor having a gate and first and second source-drains, said first source-drain coupled to said supply-voltage terminal, said gate coupled to said first input of said current-sensing circuit;

a second P-channel transistor having a gate and first and second source-drains, said first source-drain of said second P-channel transistor coupled to said second source-drain of said first P-channel transistor, said gate of said second P-channel transistor coupled to said second input of said current-sensing circuit, said second source-drain of said second P-channel transistor coupled to said output of said current-sensing circuit; and a N-channel transistor having a gate and first and second source-drains, said first source-drain of said N-channel transistor coupled to said output of said current-sensing circuit, said gate of said N-channel transistor coupled to said output of said current-summing circuit, said second source-drain of said N-channel transistor coupled to said reference-potential terminal.

8. The circuit of claim 1, wherein said pulse-stretching circuit further comprises:

a first P-channel transistor having a gate and first and second source-drains, said first source-drain coupled to said supply-voltage terminal, said gate coupled to said input of said pulse-stretching circuit, said second source-drain coupled to said output of said pulse-stretching circuit;

a first N-channel transistor having a gate and first and second source-drains, said first source-drain of said first N-channel transistor coupled to said output of said pulse-stretching circuit, said gate of said first N-channel transistor coupled to said input of said pulse-stretching circuit;

a second P-channel transistor having a gate and first and second source-drains, said first source-drain of said second P-channel transistor coupled to said supply-voltage terminal, said gate of said second P-channel transistor coupled to said input of said pulse-stretching circuit, said second source-drain of said second P-channel transistor coupled to said second source-drain of said first N-channel transistor;

a capacitor coupled between said supply-voltage terminal and said output of said pulse-stretching circuit; and a second N-channel transistor having a gate and first and second source-drains, said first source-drain of said second N-channel transistor coupled to said second source-drain of said first N-channel transistor, said gate of said second N-channel transistor coupled to said second output of said voltage-reference circuit, said second source-drain of said second N-channel transistor coupled to said reference-potential terminal.

9. A method for indicating that a power-supply voltage is below a certain level, said method comprising:

establishing a maximum current responsive to said power-supply voltage;

mirroring said maximum current to a voltage-reference circuit and to a current-sensing circuit, said current-sensing circuit including a current-summing circuit and a reset-detection circuit;

coupling outputs of said voltage-reference circuit to said current-summing circuit and to said reset-detection circuit; and coupling the output of said reset-detection circuit to a pulse stretching circuit;

the output of said pulse-stretching circuit providing a signal if said power-supply voltage is below said certain level.

10. The method of claim 9, wherein said maximum current is established by a current-bias circuit including a P-channel transistor with a source-drain path coupled between said power-supply voltage and an output and with a gate coupled to said output and including a N-channel transistor with a source-drain path coupled between said output and a reference potential and with a gate coupled to said power-supply voltage.

11. The method of claim 10, wherein the channel length of said N-channel transistor is longer than the channel length of said P-channel transistor.

12. The method of claim 9, wherein said voltage-reference circuit includes:

a first P-channel transistor having a gate and first and second source-drains, said first source-drain coupled to said power-supply voltage, said gate coupled to the output of said current-bias circuit;

a second P-channel transistor having a gate and first and second source-drains, said first source-drain of said second P-channel transistor coupled to said second source-drain of said first P-channel transistor, said gate of said second P-channel transistor and said second source-drain of said second P-channel transistor both coupled to a first output of said voltage-reference circuit;

a third P-channel transistor having a gate and first and second source-drains, said first source-drain of said third P-channel transistor coupled to said first output of said voltage-reference circuit, said gate of said third P-channel transistor coupled to a reference potential, said second source-drain of said third P-channel transistor coupled to a second output of said voltage-reference circuit;

a N-channel transistor having a gate and first and second source-drains, said gate of said N-channel transistor and said first source-drain of said N-channel transistor both coupled to said second output of said voltage-reference circuit, said second source-drain of said N-channel transistor coupled to said reference potential; and a capacitor coupled between said second output of said voltage-reference circuit and said reference-potential.

13. The method of claim 9, wherein said current sensing circuit includes:

said current-summing circuit having first and second inputs and an output, said first and second inputs of said current-summing circuit coupled respectively to first and third inputs of said current-sensing circuit;

said reset-detection circuit having first, second and third inputs and an output, said first input of said reset-detection circuit coupled to a first input of said current-sensing circuit, said second input of said reset-detection circuit coupled to a second input of said current-sensing circuit, said third input of said reset-detection circuit coupled to said output of said current-summing circuit, said output of said reset-detection circuit coupled to an output of said current-sensing circuit;

a first capacitor coupled between said output of said current-summing circuit and said power-supply voltage; and a second capacitor coupled between said output of said current-summing circuit and a reference-potential.

14. The method of claim 9, wherein said current-summing circuit includes:

a P-channel transistor having a gate and first and second source-drains, said first source-drain coupled to said power-supply voltage, said gate coupled to a first input of said current-summing circuit, said second source-drain coupled to the output of said current-summing circuit;

a first N-channel transistor having a gate and first and second source-drains, said first source-drain of said first N-channel transistor coupled to said output of said current-summing circuit, said gate of said first N-channel transistor coupled to a third input of said current-sensing circuit, said second source-drain of said first N-channel transistor coupled to a reference-potential; and a second N-channel transistor having a gate and first and second source-drains, said first source-drain and said gate of said second N-channel transistor both coupled to said output of said current-summing circuit, said second source-drain of said second N-channel transistor coupled to said reference-potential.

15. The method of claim 9, wherein said reset-detection circuit includes:

a first P-channel transistor having a gate and first and second source-drains, said first source-drain coupled to said power-supply voltage, said gate coupled to a first input of said current-sensing circuit;

a second P-channel transistor having a gate and first and second source-drains, said first source-drain of said second P-channel transistor coupled to said second source-drain of said first P-channel transistor, said gate of said second P-channel transistor coupled to a second input of said current-sensing circuit, said second source-drain of said second P-channel transistor coupled to the output of said current-sensing circuit; and a N-channel transistor having a gate and first and second source-drains, said first source-drain of said N-channel transistor coupled to said output of said current-sensing circuit, said gate of said N-channel transistor coupled to the output of said current-summing circuit, said second source-drain of said N-channel transistor coupled to a reference potential.

16. The method of claim 9, wherein said pulse-stretching circuit includes:

a first P-channel transistor having a gate and first and second source-drains, said first source-drain coupled to said power-supply voltage, said gate coupled to the input of said pulse-stretching circuit, said second source-drain coupled to said output of said pulse-stretching circuit;

a first N-channel transistor having a gate and first and second source-drains, said first source-drain of said first N-channel transistor coupled to said output of said pulse-stretching circuit, said gate of said first N-channel transistor coupled to a first input of said pulse-stretching circuit;

a second P-channel transistor having a gate and first and second source-drains, said first source-drain of said second P-channel transistor coupled to said power-supply voltage, said gate of said second P-channel transistor coupled to said first input of said pulse-stretching circuit, said second source-drain of said second P-channel transistor coupled to said second source-drain of said first N-channel transistor;

a capacitor coupled between said power-supply voltage and said output of said pulse-stretching circuit; and a second N-channel transistor having a gate and first and second source-drains, said first source-drain of said second N-channel transistor coupled to said second source-drain of said first N-channel transistor, said gate of said second N-channel transistor coupled to a second output of said voltage-reference circuit, said second source-drain of said second N-channel transistor coupled to a reference potential.

* * * * *